(12) United States Patent
Tai et al.

(10) Patent No.: US 11,469,154 B2
(45) Date of Patent: Oct. 11, 2022

(54) IGBT MODULE WITH HEAT DISSIPATION STRUCTURE HAVING SPECIFIC LAYER THICKNESS RATIO

(71) Applicant: AMULAIRE THERMAL TECHNOLOGY, INC., New Taipei (TW)

(72) Inventors: Shih-Hsi Tai, New Taipei (TW); Tze-Yang Yeh, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 13 days.

(21) Appl. No.: 17/151,203

(22) Filed: Jan. 17, 2021

(65) Prior Publication Data
US 2022/0230932 A1   Jul. 21, 2022

(51) Int. Cl.
*H01L 23/367* (2006.01)
*H01L 25/07* (2006.01)
*H01L 23/00* (2006.01)
*H01L 23/373* (2006.01)

(52) U.S. Cl.
CPC ........ *H01L 23/367* (2013.01); *H01L 23/3735* (2013.01); *H01L 24/32* (2013.01); *H01L 25/072* (2013.01); *H01L 2224/16225* (2013.01); *H01L 2224/32225* (2013.01); *H01L 2924/13055* (2013.01); *H01L 2924/13091* (2013.01); *H01L 2924/1579* (2013.01); *H01L 2924/15787* (2013.01)

(58) Field of Classification Search
CPC ... H01L 23/367; H01L 23/3735; H01L 24/32; H01L 25/072; H01L 2224/32225; H01L 2924/13055; H01L 2924/15787; H01L 2924/1579; H01L 2224/16225; H01L 2924/13091
See application file for complete search history.

(56) References Cited

U.S. PATENT DOCUMENTS

| | | | |
|---|---|---|---|
| 2010/0319898 A1* | 12/2010 | Underwood | H01L 23/3737 165/185 |
| 2011/0228485 A1* | 9/2011 | Usui | H05K 7/20509 361/720 |
| 2014/0353818 A1* | 12/2014 | Geitner | H01L 23/3107 257/734 |
| 2015/0255419 A1* | 9/2015 | Nishimoto | C04B 37/026 257/773 |

FOREIGN PATENT DOCUMENTS

| | | |
|---|---|---|
| TW | M590780 U | 2/2020 |
| TW | M591706 U | 3/2020 |
| TW | M608970 U | 3/2021 |

* cited by examiner

*Primary Examiner* — Patricia D Valenzuela
(74) *Attorney, Agent, or Firm* — Li & Cai Intellectual Property Office

(57) ABSTRACT

An IGBT module with a heat dissipation structure having a specific layer thickness ratio includes a layer of IGBT chips, an upper bonding layer, a circuit layer, an insulating layer, and a heat dissipation layer. The insulating layer is disposed on the heat dissipation layer, the circuit layer is disposed on the insulating layer, the upper bonding layer is disposed on the circuit layer, and the layer of IGBT chips is disposed on the upper bonding layer. A thickness of the insulating layer is less than 0.2 mm, a thickness of the circuit layer is between 1.5 mm and 3 mm, and a thickness ratio of the circuit layer to the insulating layer is greater than or equal to 7.5:1.

7 Claims, 2 Drawing Sheets

IGBT MODULE WITH HEAT DISSIPATION STRUCTURE HAVING SPECIFIC LAYER THICKNESS RATIO

FIELD OF THE DISCLOSURE

The present disclosure relates to an IGBT (insulated gate bipolar transistor) module, and more particularly to an IGBT module with a heat dissipation structure having a specific layer thickness ratio.

BACKGROUND OF THE DISCLOSURE

Most high-power inverters currently used in electric vehicles/hybrid vehicles use IGBT (insulated gate bipolar transistor) chips. Therefore, the heat generated during operation of the high-power inverter will cause the temperature of the IGBT chip to rise. If no proper heat dissipation measures are taken, the temperature of the IGBT chip may exceed an allowable temperature, resulting in deterioration of performance and damage. Therefore, heat dissipating efficiency of the IGBT chip has become a major issue to be addressed in the relevant industry.

Currently, a direct bonded copper (DBC) substrate has become the material of choice for an IGBT module. Referring to FIG. 1, the conventional IGBT module with a heat dissipation structure mainly includes a layer 11A of IGBT chips, an upper solder layer 12A, a DBC substrate 13A, a lower solder layer 14A, and a heat dissipation layer 15A. The DBC substrate 13A includes, from top to bottom, an upper thin copper layer 131A, an insulating layer 132A, and a lower thin copper layer 133A. However, the DBC substrate 13A has a multilayer structure and is limited in its heat-conducting ability. When heat is generated by the layer 11A of IGBT chips, it cannot be timely transferred to the heat dissipation layer 15A through the DBC substrate 13A, thereby affecting the effectiveness of thermal conductivity.

SUMMARY OF THE DISCLOSURE

In response to the above-referenced technical inadequacies, the present disclosure provides an IGBT module with a heat dissipation structure having a specific layer thickness ratio that can overcome the aforementioned drawbacks.

In one aspect, the present disclosure provides an IGBT module with a heat dissipation structure having a specific layer thickness ratio, including a layer of IGBT chips, an upper bonding layer, a circuit layer, an insulating layer, and a heat dissipation layer. The insulating layer is disposed on the heat dissipation layer, the circuit layer is disposed on the insulating layer, the upper bonding layer is disposed on the circuit layer, and the layer of IGBT chips is disposed on the upper bonding layer. A thickness of the insulating layer is less than 0.2 mm, a thickness of the circuit layer is between 1.5 mm and 3 mm, and a thickness ratio of the circuit layer to the insulating layer is greater than or equal to 7.5:1.

In certain embodiments, the insulating layer is one of an epoxy-based layer, a polyimide-based layer, or a polypropylene-based layer.

In certain embodiments, the insulating layer includes a filler, and the filler is at least one selected from aluminum oxide, aluminum nitride, silicon nitride, silicon carbide, and boron nitride.

In certain embodiments, the insulating layer is made of a ceramic material.

In certain embodiments, the ceramic material is at least one selected from aluminum oxide, aluminum nitride and silicon nitride.

In certain embodiments, the circuit layer is made of a metal material.

In certain embodiments, the circuit layer is made of a conductive polymer composite material partially filled with a conductive filler.

In certain embodiments, the IGBT module with a heat dissipation structure having a specific layer thickness ratio further includes a lower bonding layer, and the lower bonding layer is formed between the circuit layer and the insulating layer.

In certain embodiments, the lower bonding layer is one of a tin bonding layer or a sintered silver layer.

In certain embodiments, the lower bonding layer is a polymer composite layer.

One of the advantages of the present disclosure is that, by virtue of "the thickness of the insulating layer being less than 0.2 mm, the thickness of the circuit layer being between 1.5 mm and 3 mm, and the thickness ratio of the circuit layer to the insulating layer being greater than or equal to 7.5:1", the IGBT module with a heat dissipation structure having a specific layer thickness ratio provided by the present disclosure can effectively dissipate the heat generated by the IGBT chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings in which.

DETAILED DESCRIPTION OF THE EXEMPLARY EMBODIMENTS

Figure 1:
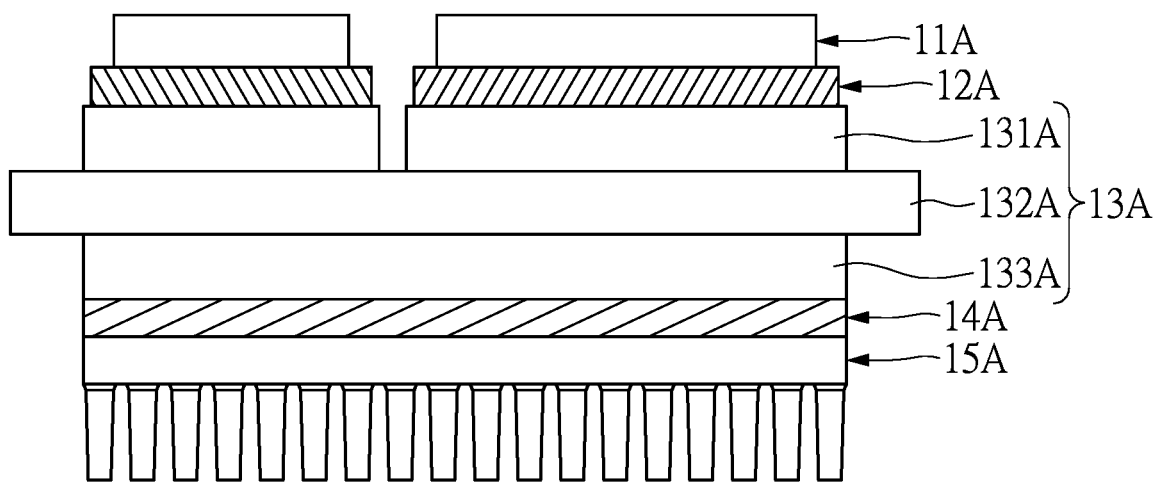
FIG. 1 is a side schematic view illustrating a conventional IGBT module with a heat dissipation structure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
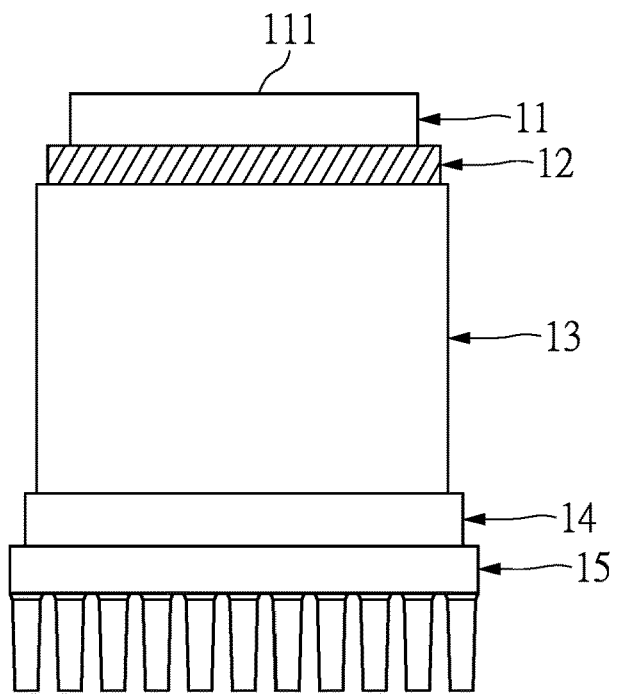
FIG. 2 is a side schematic view illustrating an IGBT module with a heat dissipation structure having a specific layer thickness ratio of the present disclosure.

Referring to FIG. 2, the present disclosure provides an IGBT module with a heat dissipation structure having a specific layer thickness ratio. As shown in FIG. 2, the IGBT module with a heat dissipation structure having a specific layer thickness ratio of the present disclosure includes, from top to bottom, a layer 11 of IGBT chips, an upper bonding layer 12, a circuit layer 13, an insulating layer 14, and a heat dissipation layer 15.

The insulating layer 14 is disposed on the heat dissipation layer 15. The heat dissipation layer 15 can be an aluminum heat sink, a water-cooling heat dissipation device, or a metal plate with a heat dissipation function, but is not limited thereto.

In one embodiment, the insulating layer 14 can be made of a ceramic material. The ceramic material can be aluminum oxide, but can also be selected from aluminum nitride, silicon nitride, and silicon carbide.

In one embodiment, the insulating layer 14 can be made of a polymer composite material. Further, the insulating layer 14 can be an epoxy-based layer. Furthermore, the insulating layer 14 includes at least one of the following fillers: aluminum oxide, aluminum nitride, silicon nitride, silicon carbide, or boron nitride. In other embodiments, the insulating layer 14 can be a polyimide-based layer or a polypropylene-based layer.

The circuit layer 13 is disposed on the insulating layer 14, such that insulation is formed between the circuit layer 13 and the heat dissipation layer 15 through the insulating layer 14, and the circuit layer 13 conducts heat through the insulating layer 14 to the heat dissipation layer 15.

In one embodiment, the circuit layer 13 can be made of a metal material, e.g., copper. Further, the circuit layer 13 may be a circuit layer with a predetermined thickness formed by using supersonic flows to impinge granulated metal materials onto the surface of the insulating layer 14 at high speed. In another embodiment, the circuit layer 13 may be made of at least one thick copper block.

In one embodiment, the circuit layer 13 can be made of a conductive polymer composite material partially filled with a conductive filler (such as a metal material).

The upper bonding layer 12 is disposed on the circuit layer 13. The upper bonding layer 12 can be a tin bonding layer, but can also be a sintered silver layer. The layer 11 of IGBT chips can include one or more IGBT chips 111, and one of the IGBT chips 111 can be replaced with a diode chip. In addition, the layer 11 of IGBT chips is bonded onto the upper circuit layer 13 through the upper bonding layer 12. The heat generated by the one or more IGBT chips 111 can be conducted to the heat dissipation layer 15 by the circuit layer 13 and the insulating layer 14 to be dissipated outward.

In addition, in order to dissipate the heat generated by the IGBT chip 111 even more quickly, a thickness of the insulating layer 14 of the IGBT module with a heat dissipation structure having a specific layer thickness ratio provided by the present disclosure is less than 0.2 mm, a thickness of the circuit layer 13 is between 1.5 mm and 3 mm, and a thickness ratio of the circuit layer 13 to the insulating layer 14 is greater than or equal to 7.5:1.

According to temperature measurement results, the measured temperature of the IGBT chip 111 is 184.03° C. when the thickness of each of the insulating layer 14 and the circuit layer 13 is 0.1 mm. When the thickness of the insulating layer 14 is 0.1 mm and that of the circuit layer 13 is 0.5 mm, the measured temperature of the IGBT chip 111 is 168.27° C. When the thickness of the insulating layer 14 is 0.1 mm and that of the circuit layer 13 is 1 mm, the measured temperature of the IGBT chip 111 is 159.77° C. When the thickness of the insulating layer 14 is 0.1 mm and that of the circuit layer 13 is 2 mm, the measured temperature of the IGBT chip 111 is 150.93° C. When the thickness of the insulating layer 14 is 0.1 mm and that of the circuit layer 13 is 3 mm, the measured temperature of the IGBT chip 111 is 146.69° C.

Therefore, the actual test results clearly show that when the thickness of the insulating layer 14 is less than 0.2 mm and that of the circuit layer 13 is between 1.5 mm and 3 mm, which makes the thickness ratio of the circuit layer 13 to the insulating layer 14 greater than or equal to 7.5:1, the heat generated by the IGBT chip 111 can be dissipated more effectively.

Figure 3:
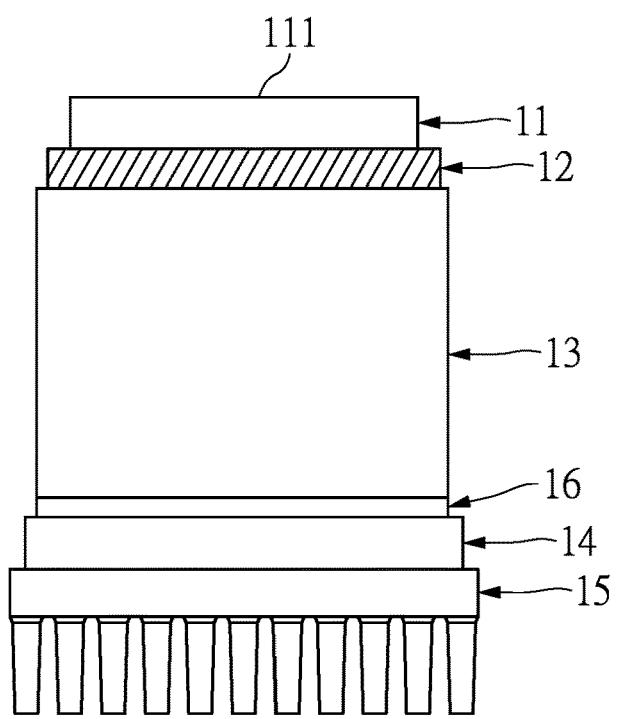
FIG. 3 is a side schematic view illustrating another IGBT module with a heat dissipation structure having a specific layer thickness ratio of the present disclosure.

Referring to FIG. 3, the present disclosure provides another IGBT module with a heat dissipation structure having a specific layer thickness ratio. As shown in FIG. 3, the IGBT module with a heat dissipation structure having a specific layer thickness ratio of the present disclosure includes, from top to bottom, a layer 11 of IGBT chips, an upper bonding layer 12, a circuit layer 13, a lower boding layer 16, an insulating layer 14, and a heat dissipation layer 15.

In this embodiment, the IGBT module with a heat dissipation structure having a specific layer thickness ratio further includes the lower bonding layer 16. Moreover, in order to achieve a better bonding between the circuit layer 13 and the insulating layer 14, the lower bonding layer 16 is formed there-between.

In one embodiment, the lower bonding layer 16 can be a tin bonding layer, but can also be a sintered silver layer.

In one embodiment, the lower bonding layer 16 can be a polymer composite layer, such as an epoxy-based layer, a polyimide-based layer, or a polypropylene-based layer.

In conclusion, by virtue of "the thickness of the insulating layer 14 being less than 0.2 mm, the thickness of the circuit layer 13 being between 1.5 mm and 3 mm, and the thickness ratio of the circuit layer 13 to the insulating layer 14 being greater than or equal to 7.5:1", the IGBT module with a heat dissipation structure having a specific layer thickness ratio provided by the present disclosure can effectively dissipate the heat generated by the IGBT chip 111.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An IGBT module with a heat dissipation structure having a specific layer thickness ratio, comprising: a layer of IGBT chips, an upper bonding layer, a circuit layer, an insulating layer, and a heat dissipation layer; wherein the insulating layer is disposed on the heat dissipation layer, the circuit layer is disposed on the insulating layer, the upper bonding layer is disposed on the circuit layer, and the layer of IGBT chips is disposed on the upper bonding layer; wherein a thickness of the insulating layer made of a polymer composite material is less than 0.2 mm, a thickness of the circuit layer is between 1.5 mm and 3 mm, and a thickness ratio of the circuit layer to the insulating layer is greater than or equal to 7.5:1.

2. The IGBT module according to claim 1, wherein the insulating layer includes a filler, and the filler is at least one selected from aluminum oxide, aluminum nitride, silicon nitride, silicon carbide, and boron nitride.

3. The IGBT module according to claim 1, wherein the circuit layer is made of a metal material.

4. The IGBT module according to claim 1, wherein the circuit layer is made of a conductive polymer composite material partially filled with a conductive filler.

5. The IGBT module according to claim 1, further comprising: a lower bonding layer; wherein the lower bonding layer is formed between the circuit layer and the insulating layer.

6. The IGBT module according to claim 5, wherein the lower bonding layer is one of a tin bonding layer or a sintered silver layer.

7. The IGBT module according to claim 5, wherein the lower bonding layer is a polymer composite layer.

* * * * *